(12) United States Patent
Otsuka et al.

(10) Patent No.: US 11,821,086 B2
(45) Date of Patent: Nov. 21, 2023

(54) PARTICLE COATING METHOD AND PARTICLE COATING APPARATUS

(71) Applicant: Seiko Epson Corporation, Tokyo (JP)

(72) Inventors: Kenji Otsuka, Chino (JP); Kazuhiro Gomi, Chino (JP)

(73) Assignee: SEIKO EPSON CORPORATION

( * ) Notice: Subject to any disclaimer, the term of this patent is extended or adjusted under 35 U.S.C. 154(b) by 39 days.

(21) Appl. No.: 17/471,230

(22) Filed: Sep. 10, 2021

(65) Prior Publication Data
US 2021/0404063 A1 Dec. 30, 2021

Related U.S. Application Data

(62) Division of application No. 16/802,937, filed on Feb. 27, 2020, now Pat. No. 11,220,749.

(30) Foreign Application Priority Data
Feb. 28, 2019 (JP) .................. 2019-035560

(51) Int. Cl.
*C23C 16/455* (2006.01)
*C23C 16/02* (2006.01)
*C23C 16/44* (2006.01)
*C23C 16/56* (2006.01)

(52) U.S. Cl.
CPC ....... *C23C 16/45555* (2013.01); *C23C 16/02* (2013.01); *C23C 16/4412* (2013.01); *C23C 16/45544* (2013.01); *C23C 16/45553* (2013.01); *C23C 16/56* (2013.01)

(58) Field of Classification Search
CPC ........ C23C 16/45544; C23C 16/45553; C23C 16/4417; C23C 16/45555; C23C 16/442; H01F 1/06; H01L 21/0228
USPC ........................................... 118/716
See application file for complete search history.

(56) References Cited

U.S. PATENT DOCUMENTS

| | | | |
|---|---|---|---|
| 2014/0120419 A1 | 5/2014 | Pushparaj et al. | |
| 2017/0062191 A1 | 3/2017 | Zafiropoulo et al. | |
| 2017/0313437 A1* | 11/2017 | Humfeld | B64D 37/16 |
| 2018/0179629 A1 | 6/2018 | Mancevski | |
| 2020/0385860 A1* | 12/2020 | Hirose | B22F 1/16 |

FOREIGN PATENT DOCUMENTS

| | | |
|---|---|---|
| JP | H04-032204 A | 2/1992 |
| JP | 2004-152686 A | 5/2004 |
| JP | 2017-075391 A | 4/2017 |

* cited by examiner

*Primary Examiner* — Tabassom Tadayyon Eslami
(74) *Attorney, Agent, or Firm* — Harness, Dickey & Pierce, P.L.C.

(57) ABSTRACT

A particle coating method includes placing magnetic particles in a vessel, fixing the magnetic particles by a magnetic force caused by a magnetic field generated in the vessel, and forming a coating film on surfaces of the magnetic particles by an atomic layer deposition method. Further, the method preferably includes forming a coating film on surfaces of the magnetic particles by an atomic layer deposition method in a state where the magnetic particles are fixed by the magnetic force in a first direction, thereby obtaining coated magnetic particles, and forming a coating film on surfaces of the coated magnetic particles in a state where the coated magnetic particles are fixed by the magnetic force in a second direction different from the first direction.

5 Claims, 9 Drawing Sheets

PARTICLE COATING METHOD AND PARTICLE COATING APPARATUS

CROSS-REFERENCE TO RELATED APPLICATIONS

This application is a divisional patent application of U.S. patent application Ser. No. 16/802,937, filed Feb. 27, 2020, Now U.S. Pat. No. 1,181,716 which claims priority to Japanese Patent Application No. 2019-035560, filed Feb. 28, 2019, the disclosures of which are hereby expressly incorporated by reference herein in their entireties.

BACKGROUND

1. Technical Field

The present disclosure relates to a particle coating method and a particle coating apparatus.

2. Related Art

A magnetic powder used in an inductor or the like needs to be subjected to an insulation treatment on surfaces of particles so as to suppress an eddy current flowing between the particles. Therefore, a method for forming an insulating coating film on the surfaces of the particles of the magnetic powder using various film formation methods has been studied.

For example, JP-A-2017-75391 (Patent Document 1) discloses a method for coating particles with an oxide using a phenomenon called plasma-enhanced atomic layer deposition (PE-ALD). Specifically, the particles are placed in a chamber, and the chamber is rotated so as to stir the particles by a blade provided in the chamber. Then, the inside of the chamber is depressurized in the state, and a coating film (ALD coating film) is formed by plasma-enhanced atomic layer deposition, whereby an ALD coating film can be formed while suppressing aggregation of the particles to minimum. By doing this, a thin and uniform coating film can be formed.

On the other hand, in the method described in Patent Document 1, the powder is sometimes stirred up in the chamber during stirring and introduction of a gas when forming the film. If such stirring up of the powder occurs, when vacuuming the inside of the chamber, the stirred-up powder may be drawn into a vacuum pump. When drawing into the vacuum pump occurs, a problem that breakdown of the vacuum pump or loss of the powder is caused.

SUMMARY

A particle coating method according to an application example of the present disclosure includes placing magnetic particles in a vessel, fixing the magnetic particles by a magnetic force caused by a magnetic field generated in the vessel, and forming a coating film on surfaces of the magnetic particles by an atomic layer deposition method.

DESCRIPTION OF EXEMPLARY EMBODIMENTS

Hereinafter, preferred embodiments of a particle coating method and a particle coating apparatus according to the present disclosure will be described in detail based on the accompanying drawings.

First Embodiment

Particle Coating Apparatus

First, a particle coating apparatus according to a first embodiment will be described.

Figure 1:
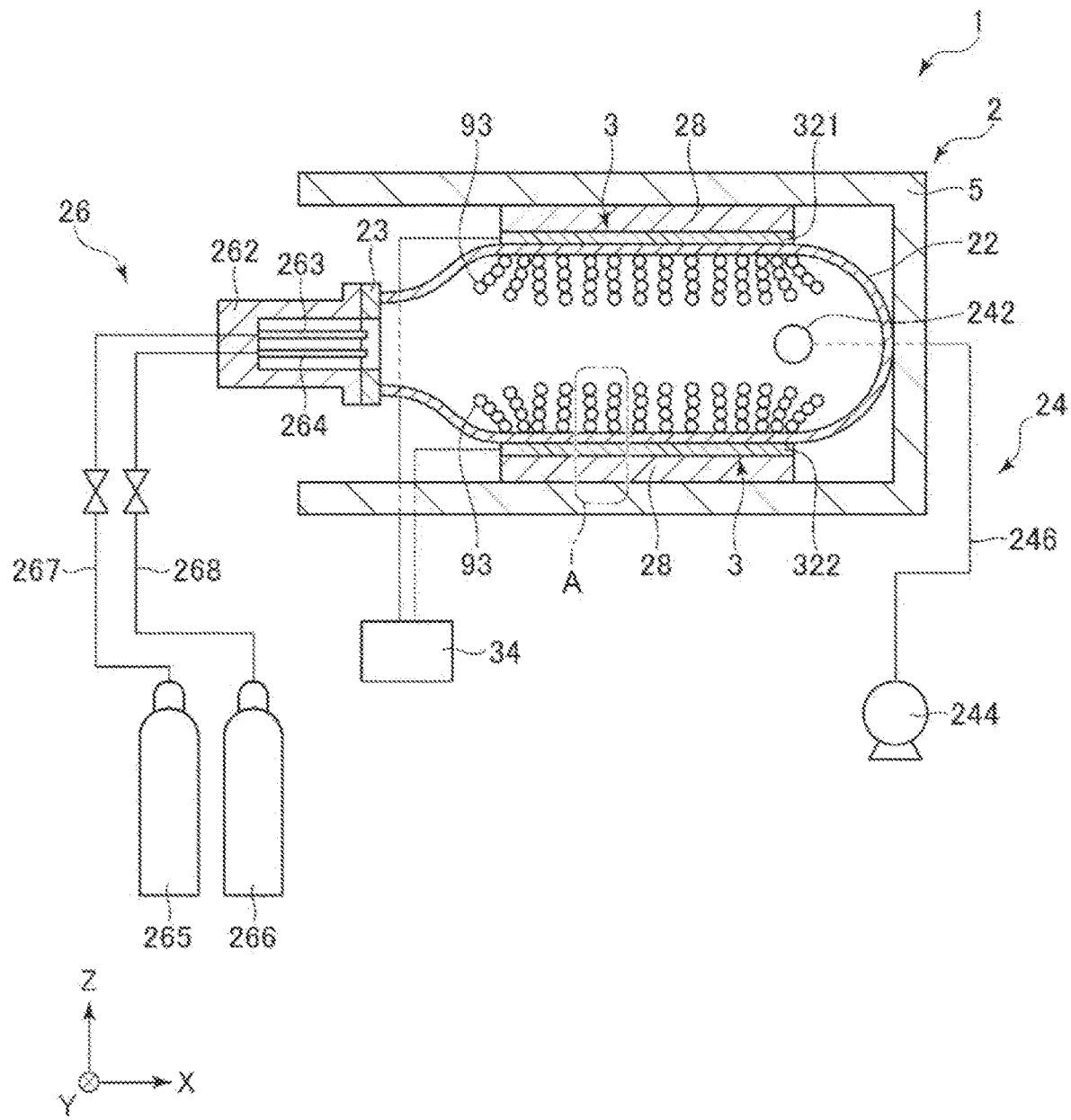
FIG. 1 is a cross-sectional view showing a particle coating apparatus according to a first embodiment.
Figure 2:
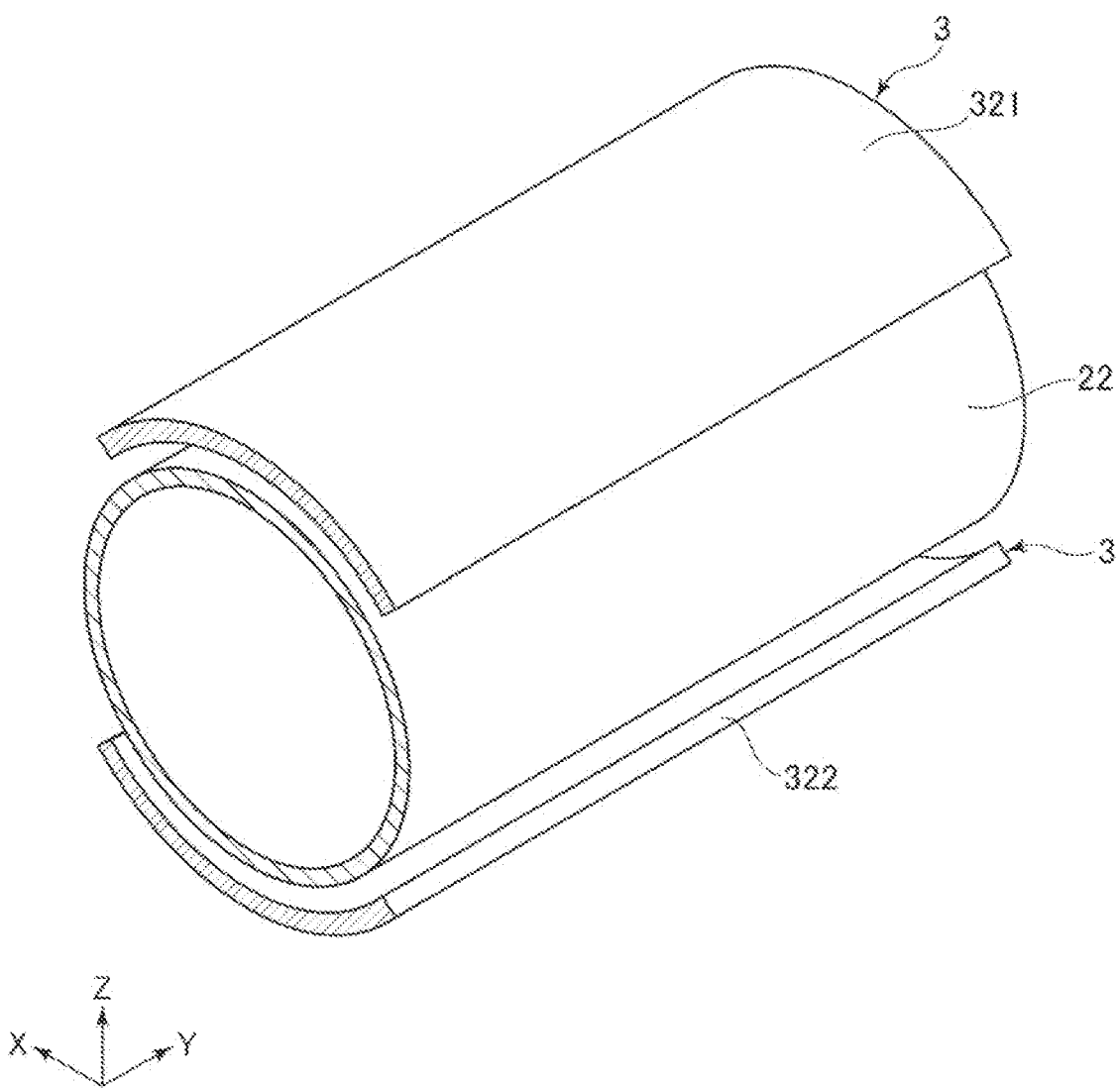
FIG. 2 is an exploded perspective view in which a portion of the particle coating apparatus shown in FIG. 1 is cut out and exploded.
Figure 3:
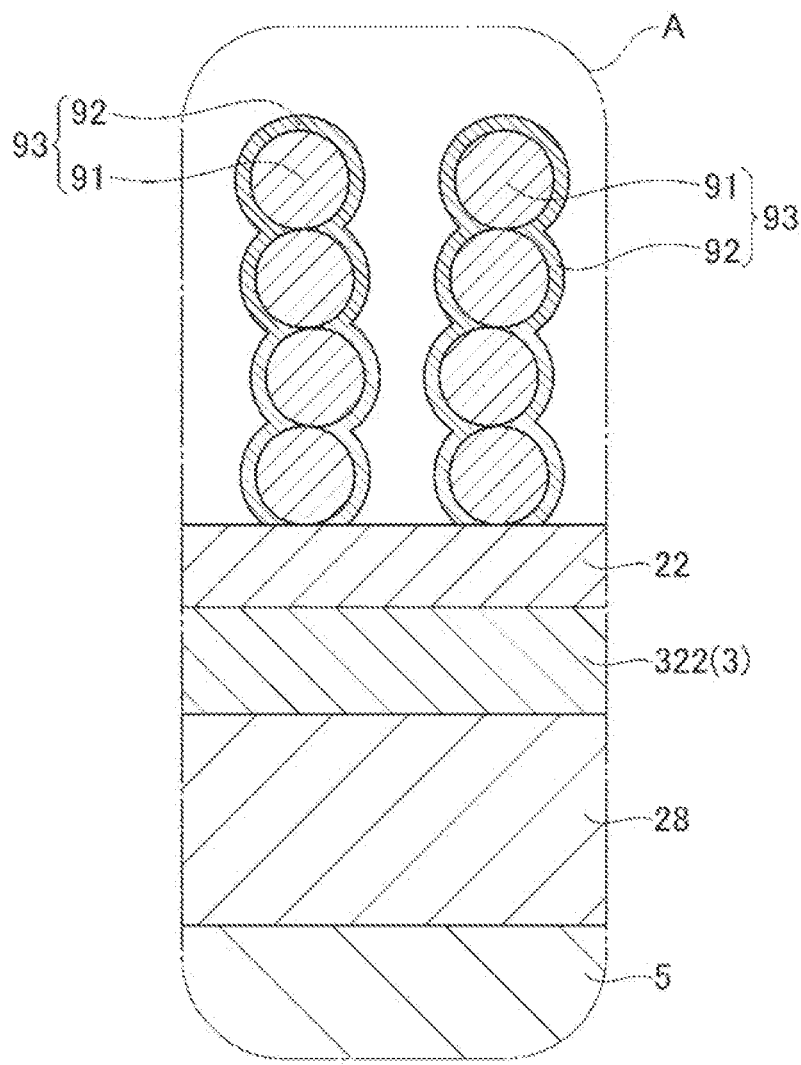
FIG. 3 is an enlarged view of a portion A in FIG. 1 showing coated magnetic particles, each including a magnetic particle and a coating film formed on a surface of the magnetic particle by the particle coating apparatus shown in FIG. 1.

FIG. 1 is a cross-sectional view showing a particle coating apparatus 1 according to the first embodiment. FIG. 2 is an exploded perspective view in which a portion of the particle coating apparatus shown in FIG. 1 is cut out and exploded. FIG. 3 is an enlarged view of a portion A in FIG. showing coated magnetic particles 93, each including a magnetic particle 91 and a coating film 92 formed on a surface of the magnetic particle 91 by the particle coating apparatus 1 shown in FIG. 1. Note that in FIGS. 1 and 2 and drawings described below, for the sake of convenience of explanation, an X axis, a Y axis, and a Z axis are set as three axes orthogonal to one another. Further, a description will be given by assuming that the +Z side is the upper side and the −Z side is the lower side.

The particle coating apparatus 1 shown in FIG. 1 is provided with a chamber 22 (vessel) housing the magnetic particles 91 shown in FIG. 3, and includes a film formation device 2 for forming the coating film 92 on surfaces of the magnetic particles 91 by an atomic layer deposition (ALD) method, and a magnetic force generation portion 3 generating a magnetic field in the chamber 22 so as to fix the magnetic particles 91 by a magnetic force caused by the magnetic field. Further, the film formation device 2 includes, other than the chamber 22 described above, an exhaust portion 24 exhausting the inside of the chamber 22, a gas introduction portion 26 introducing a gas into the chamber 22, and a heating portion 28.

Such a particle coating apparatus 1 forms the coating film 92 on the surfaces of the magnetic particles 91 in a state where the magnetic particles 91 are fixed by a magnetic force caused by a magnetic field generated by the magnetic force generation portion 3. According to this, the magnetic particles 91 can be held by the magnetic force, and therefore, when the coating film 92 is formed by an atomic layer deposition method, even if the inside of the chamber 22 is exhausted by the exhaust portion 24, stirring up of the magnetic particles 91 is suppressed. As a result, the magnetic particles 91 can be prevented from being drawn into the exhaust portion 24 so that breakdown of the exhaust portion 24 or loss of the magnetic particles 91 can be suppressed.

Hereinafter, the respective portions of the particle coating apparatus 1 will be described in detail.

As described above, the film formation device 2 shown in FIG. 1 includes the chamber 22, the exhaust portion 24, the gas introduction portion 26, and the heating portion 28. In such a film formation device 2, the magnetic particles 91 are housed in the chamber 22, and the inside of the chamber 22 is exhausted by the exhaust portion 24, and thereafter, a gas is introduced by the gas introduction portion 26. Then, the magnetic particles 91 are heated by the heating portion 28. By the heating, the raw material gas introduced into the chamber 22 is thermally decomposed, and a decomposition product is adsorbed onto the surfaces of the magnetic particles 91, and finally, the coating film 92 is formed.

As shown in FIGS. 1 and 2, the chamber 22 has a cylindrical shape with an axis parallel to the Y axis direction. An end portion at the −Y side of the chamber 22 is opened, and an end portion at the +Y side of the chamber 22 is closed.

Examples of a constituent material of the chamber 22 include glass materials such as quartz glass, ceramic materials such as alumina, and non-magnetic metal materials such as aluminium, titanium, and permalloy.

Further, to the end portion at the −Y side of the chamber 22, a flange 23 is hermetically coupled. Further, the chamber 22 and the below-mentioned gas introduction portion 26 are hermetically coupled to each other through this flange 23.

The exhaust portion 24 is provided in the vicinity of the end portion at the +Y side of the chamber 22, and includes an exhaust port 242 provided so as to discharge a gas to the +X side, an exhaust pump 244, and a pipe 246 coupling the exhaust port 242 and the exhaust pump 244 to each other. By exhausting the inside of the chamber 22 using the exhaust portion 24, the inside of the chamber 22 is depressurized and can be brought into a so-called vacuum state.

The exhaust port 242 may be provided with a valve as needed. By closing the valve, the inside of the chamber 22 can be hermetically sealed.

The gas introduction portion 26 includes a support member 262 hermetically coupled to the flange 23, nozzles 263 and 264 provided inside the support member 262, a raw material gas storage portion 265 storing a raw material gas, an oxidizing agent storage portion 266 storing an oxidizing agent, a pipe 267 coupling the raw material gas storage portion 265 and the nozzle 263 to each other, and a pipe 268 coupling the oxidizing agent storage portion 266 and the nozzle 264 to each other. By the gas introduction portion 26, the raw material gas, the oxidizing agent, etc. necessary for forming the coating film 92 are supplied into the chamber 22.

The support member 262 is coupled to the flange 23. According to this, a closed space is formed by the chamber 22, the flange 23, and the support member 262, and this closed space is brought into a depressurized state when forming the coating film 92.

The nozzle 263 is provided inside the support member 262, and sprays the raw material gas sent through the pipe 267 into the chamber 22. Further, the nozzle 264 is also provided inside the support member 262, and sprays the oxidizing agent sent through the pipe 268 into the chamber 22. According to this, the raw material gas and the oxidizing agent can be uniformly supplied into the chamber 22, so that the coating film 92 having a predetermined film thickness can be formed on the surfaces of the magnetic particles 91 housed in the chamber 22.

In the middle of each of the pipes 267 and 268, a valve for adjusting the flow rate of the raw material gas or the oxidizing agent is provided, and a partial pressure of each of the raw material gas and the oxidizing agent in the chamber 22 can be controlled.

The raw material gas or the oxidizing agent is supplied together with a carrier gas containing an inert gas such as nitrogen gas or argon gas as a main component as needed.

The heating portion 28 is provided outside the chamber 22. In this embodiment, as shown in FIG. 1, the heating portion 28 is provided dividedly at an upper face and a lower face in the outer face of the chamber 22. On the other hand, as described later, at the upper face and the lower face of the chamber 22, the magnetic force generation portion 3 is also provided. Therefore, the heating portion 28 heats the magnetic particles 91 held by a magnetic force caused by a magnetic field generated by the magnetic force generation portion 3 from the outside of the chamber 22 to increase the temperature.

As the heating portion 28, for example, a heater block having a built-in heater wiring, a film heater, a sheet heater, a sheath heater, an infrared radiant heater radiating infrared light, or the like is used although there is no particular restriction on the heating principle or arrangement as long as it is a member capable of heating the magnetic particles 91 housed inside the chamber 22.

Further, the film formation device 2 shown in FIG. 1 includes the chamber 22, the heating portion 28, and a cover covering the below-mentioned magnetic force generation portion 3.

In the film formation device 2 as described above, the coating film 92 is formed by an atomic layer deposition method as described above. The atomic layer deposition method is a method for forming a film by, for example, alternately repeating introduction and discharge of two or more types of gases of the raw material gas and the oxidizing agent so as to allow the raw material molecules adsorbed onto a film-formation target face to react with each other. In this method, the film thickness of the coating film 92 to be formed can be controlled with high accuracy. Therefore, the coating film 92 that is particularly thin can be formed. Due to this, for example, when the magnetic particles 91 have soft magnetism, if the film thickness of the coating film 92 to cover the surfaces thereof can be made thin, a powder magnetic core in which the density of the magnetic particles 91 per unit volume is high while favorably maintaining the insulating property of the magnetic particles 91 can be produced. Accordingly, the coated magnetic particles 93 capable of producing a powder magnetic core or the like having particularly high magnetic properties such as a magnetic flux density and a magnetic permeability can be realized.

In addition, the film is formed while the raw material gas and the oxidizing agent are also penetrating into small gaps, and therefore, a portion where the film is not formed, that is, a pin hole is hardly generated, and the coating film 92 having a uniform film thickness can be formed. As a result, the coated magnetic particles 93 formed by coating the surfaces of the magnetic particles 91 with the coating film 92 having a uniform and thin film thickness can be obtained.

The magnetic force generation portion 3 includes a pair of electromagnets 321 and 322, and a controller 34 electrically coupled to these electromagnets 321 and 322.

The electromagnet 321 is provided at the upper face of the chamber 22. On the other hand, the electromagnet 322 is provided at the lower face of the chamber 22. The electric current direction is set so that the polarities at the chamber 22 side of the pair of electromagnets 321 and 322 are different from each other. For example, when the polarity at the chamber 22 side of the electromagnet 321 is N pole, the polarity at the chamber 22 side of the electromagnet 322 is S pole. Therefore, in the chamber 22, a magnetic field based on a magnetic force line coupling the electromagnet 321 and the electromagnet 322 to each other is generated. When the magnetic particles 91 are placed in this magnetic field, a magnetic force is generated in the magnetic particles 91.

The controller 34 controls the direction and magnitude of the electric current flowing through the pair of electromagnets 321 and 322. According to this, the direction and magnitude of the magnetic force generated in the magnetic particles 91 in the chamber 22 are controlled.

When a magnetic field is generated in the chamber 22 by the magnetic force generation portion 3 as described above, the magnetic particles 91 housed in the chamber 22 are coupled to one another along the magnetic force line. According to this, many magnetic particles 91 can be fixed and held. As a result, even if the inside of the chamber 22 is exhausted when the coating film 92 is formed by an atomic layer deposition method, stirring up of the magnetic particles 91 is suppressed. Accordingly, the magnetic particles 91 can be prevented from being drawn into the exhaust portion 24 so that breakdown of the exhaust portion 24 or loss of the magnetic particles 91 can be suppressed.

Further, when many needle-like aggregates of the magnetic particles 91 as shown in FIG. 3 are formed, such aggregates are formed so as to be in parallel with each other in the chamber 22, and therefore, a gap is generated between the aggregates. Due to this, many surfaces of the respective magnetic particles 91 are exposed, and when the coating film 92 is formed by depositing the raw material on the surfaces of the magnetic particles 91 using an atomic layer deposition method, the coating film 92 can be formed on many surfaces excluding portions where the magnetic particles 91 are in contact with each other. Therefore, by forming the coating film 92 a plurality of times in a divided manner while changing the way of coupling the magnetic particles 91 to one another or the like, the coating film 92 covering almost the entire surfaces of the magnetic particles 91 can be formed.

The arrangement and shape of the electromagnets 321 and 322 shown in FIG. 2 are not particularly limited, however, for example, they are molded into a shape so as to closely adhere to the upper face or the lower face of the chamber 22, or a shape so as to come into contact therewith through an intervening material. According to this, a stronger magnetic force is allowed to act on the magnetic particles 91 in the chamber 22, and as shown in FIG. 3, the magnetic particles 91 can be coupled to one another to make the aggregate longer. As a result, it becomes possible to form the coating film 92 having a uniform film thickness for more magnetic particles 91 at a time.

At least one of the electromagnets 321 and 322 may be replaced with a permanent magnet, or an electromagnet and a permanent magnet may be used together for both. When a permanent magnet is used, for example, a mechanism for making the permanent magnet and the chamber 22 approach or separate from each other may be provided. According to this, the strength of the magnetic field to be generated in the chamber 22 can be adjusted.

Further, the electromagnets 321 and 322 that are the magnetic force generation portion 3 shown in FIG. 2 are provided outside the chamber 22 that is a vessel. Therefore, the magnetic particles 91 do not directly adhere to the electromagnets 321 and 322, and the coated magnetic particles 93 after forming the coating film 92 can be easily separated from the magnetic field.

In this embodiment, the electromagnets 321 and 322 are used as the magnetic force generation portion 3. According to this, a magnetic force can be generated at a desired timing, and therefore, for example, while a magnetic force is not generated when the magnetic particles 91 are transferred, a magnetic force can be generated when the inside of the chamber 22 is exhausted by the exhaust portion 24. As a result, both suppression of stirring up of the magnetic particles 91 and easy transfer of the magnetic particles 91 can be achieved.

As described above, the particle coating apparatus according to the embodiment includes the film formation device 2 for forming the coating film 92 on the surfaces of the magnetic particles 91 by an atomic layer deposition method, and the magnetic force generation portion 3 generating a magnetic field in the chamber 22 so as to fix the magnetic particles 91 by a magnetic force caused by the magnetic field. Further, the film formation device 2 includes the chamber 22 that is a vessel housing the magnetic particles 91, the exhaust portion 24 exhausting and depressurizing the inside of the chamber 22, and the gas introduction portion 26 introducing the raw material gas and the like into chamber 22.

Such a particle coating apparatus 1 forms the coating film 92 on the surfaces of the magnetic particles 91 in a state where the magnetic particles 91 are fixed by a magnetic force caused by a magnetic field generated by the magnetic force generation portion 3. According to this, the magnetic particles 91 can be held by the magnetic force, and therefore, when the coating film 92 is formed by an atomic layer deposition method, even if the inside of the chamber 22 is exhausted by the exhaust portion 24, stirring up of the magnetic particles 91 is suppressed. As a result, the magnetic particles 91 can be prevented from being drawn into the exhaust portion 24 so that breakdown of the exhaust portion 24 or loss of the magnetic particles 91 can be suppressed. Further, the coverage of the coating film 92 provided on the surfaces of the magnetic particles 91 can be increased as described above.

Hereinafter, the respective portions of the particle coating apparatus 1 will be described in detail.

As described above, the film formation device 2 shown in FIG. 1 includes the chamber 22, the exhaust portion 24, the gas introduction portion 26, and the heating portion 28. In such a film formation device 2, the magnetic particles 91 are housed in the chamber 22, and the inside of the chamber 22 is exhausted by the exhaust portion 24, and thereafter, a gas is introduced by the gas introduction portion 26. Then, the magnetic particles 91 are heated by the heating portion 28, whereby the coating film 92 is formed on the surfaces of the magnetic particles 91.

Next, the magnetic particles 91 will be described.

As the magnetic particles 91, particles having hard magnetism may be used, but preferably particles having soft magnetism are used. In the particles having soft magnetism, magnetization of the particles can be controlled by the presence or absence of a magnetic field, and therefore, it is possible to switch between fixation and release from fixation by the presence or absence of generation of a magnetic field by the electromagnets 321 and 322. Therefore, transport or the like of the magnetic particles 91 or the coated magnetic particles 93 can be easily performed.

Examples of the constituent material of the magnetic particles 91 include pure iron, various types of Fe-based alloys such as an Fe—Si-based alloy such as silicon steel, an Fe—Ni-based alloy such as permalloy, an Fe—Co-based alloy such as permendur, an Fe—Si—Al-based alloy such as Sendust, and an Fe—Cr—Si-based alloy, and other than these, various types of Ni-based alloys, various types of Co-based alloys, and various types of amorphous alloys. Among these, as the amorphous alloys, for example, Fe-based alloys such as Fe—Si—B-based, Fe—Si—B—C-based, Fe—Si—B—Cr—C-based, Fe—Si—Cr-based, Fe—B-based, Fe—P—C-based, Fe—Co—Si—B-based, Fe—Si—B—Nb-based, and Fe—Zr—B-based alloys, Ni-based alloys such as Ni—Si—B-based and Ni—P—B-based alloys, Co-based alloys such as Co—Si—B-based alloys, and the like are exemplified.

The average particle diameter of the magnetic particles 91 is not particularly limited, but is preferably 50 μm or less, more preferably 1 μm or more and 30 μm or less, further more preferably 2 μm or more and 20 μm or less. For example, when the magnetic particles 91 are soft magnetic, the eddy current loss is suppressed small, and therefore, such relatively fine magnetic particles 91 are useful as magnetic particles for a powder magnetic core.

Particle Coating Method

Next, as a particle coating method according to an embodiment, a method for forming the coating film 92 on the surfaces of the magnetic particles 91 using the particle coating apparatus 1 shown in FIG. 1 will be described.

Figure 4:
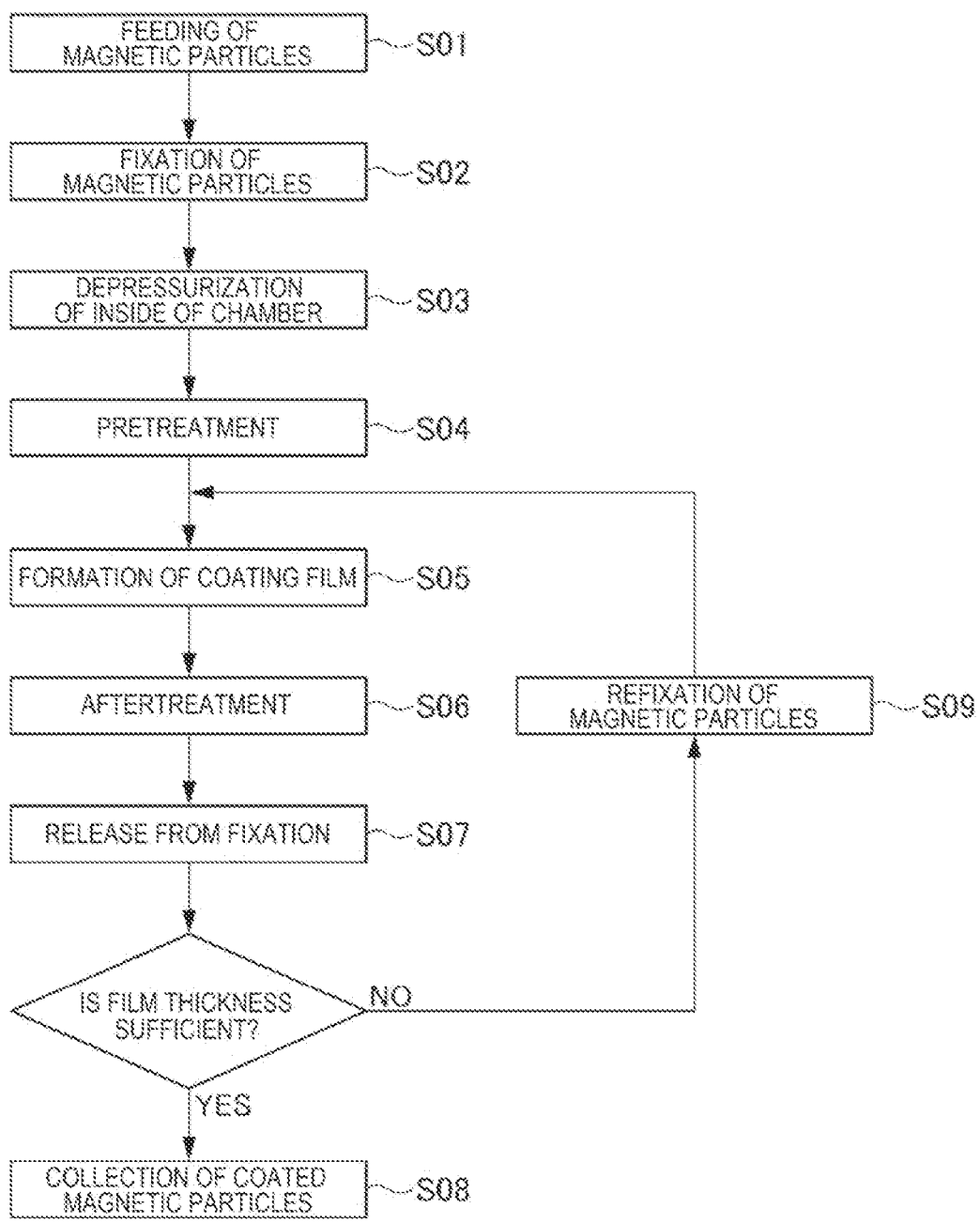
FIG. 4 is a process chart showing a particle coating method according to an embodiment.

FIG. 4 is a process chart showing the particle coating method according to the embodiment.

(S01) Feeding of Magnetic Particles

First, the magnetic particles 91 are fed into the chamber 22. When the magnetic particles 91 are fed, for example, the operation may be performed by opening between the flange 23 and the support member 262 of the gas introduction portion 26 of the particle coating apparatus 1 shown in FIG. 1. The feeding path is not particularly limited. Further, when performing the feeding, the magnetic particles 91 may be transported while performing fixation and release from fixation of the magnetic particles 91 using a movable magnetic force generator.

(S02) Fixation of Magnetic Particles

Subsequently, the inside of the chamber 22 is hermetically sealed, and the electromagnets 321 and 322 are energized. By doing this, a magnetic field is generated between the electromagnets 321 and 322, and a magnetic force acts on the magnetic particles 91, and therefore, accompanying this, the magnetic particles 91 are fixed to the inner face of the chamber 22. At that time, the magnetic particles 91 are distributed so that a plurality of particles are coupled to one another as described above, and therefore, a state where relatively many gaps are present around the respective magnetic particles 91 is brought about.

(S03) Depressurization of Inside of Chamber

Subsequently, the inside of the chamber 22 is exhausted by the exhaust pump 244. By doing this, the inside of the chamber 22 is depressurized and brought into a vacuum state. At that time, particularly when the exhaust pump 244 is operated, air in the chamber 22 is suddenly stirred, and therefore, there is a concern that the magnetic particles 91 may be stirred up. However, in this embodiment, the magnetic particles 91 are fixed by a magnetic force, and therefore, this stirring up can be suppressed. As a result, breakdown of the exhaust pump 244, loss of the magnetic particles 91, or the like accompanying the stirring up of the magnetic particles 91 can be suppressed.

(S04) Pretreatment

Subsequently, the magnetic particles 91 fed into the chamber 22 is subjected to a pretreatment. Examples of the pretreatment include an ozone treatment, a radical treatment, an ultraviolet light treatment, a plasma treatment, a corona treatment, a heating treatment, a drying treatment, and a solvent treatment.

Among these, the pretreatment preferably includes a treatment for oxidizing the surfaces of the magnetic particles 91 or a treatment for drying the magnetic particles 91. By the treatment for oxidizing the surfaces of the magnetic particles 91, an oxide film on the surface of the magnetic particle 91 can be enhanced. According to this, in the formation of the below-mentioned coating film 92, adsorption of the raw material gas is promoted, and therefore, the coating film 92 can be more uniformly formed.

Examples of the treatment for oxidizing the surfaces of the magnetic particles 91 include an ozone treatment and a radical treatment. In the ozone treatment, ozone gas is introduced into the chamber 22. In the magnetic particles 91 coming into contact with the ozone gas, the oxide film on the surface is enhanced. In addition, in the radical treatment, for example, by introducing hydrogen peroxide into the chamber 22, a hydroxyl radical is generated so as to enhance the oxide film on the surfaces of the magnetic particles 91.

In the treatment for drying the magnetic particles 91, water adsorbed onto the surfaces of the magnetic particles 91 is removed. Such water causes inhibition of the formation of the below-mentioned coating film 92. Therefore, by removing water in the pretreatment, the adhesion of the coating film 92 can be enhanced. Examples of the treatment for drying the magnetic particles 91 include a heating treatment for heating the magnetic particles 91, a drying treatment for exposure to a dehydrated gas, and a solvent treatment for exposure to a water-soluble solvent such as an alcohol.

Further, the pretreatment as described above is a treatment to be performed before forming the coating film 92 on the surfaces of the magnetic particles 91, and is preferably performed in a state where the magnetic particles 91 are fixed by a magnetic force caused by a magnetic field generated by the magnetic force generation portion 3. The magnetic particles 91 fixed by a magnetic force are distributed so that a plurality of particles are coupled to one another and are aligned in a so-called needle shape. Therefore, many gaps are present around the respective magnetic particles 91, and thus, the pretreatment can be uniformly and efficiently carried out through the gaps.

At that time, the pretreatment may be performed while alternately switching the direction of an electric current allowed to flow through the electromagnets 321 and 322. That is, the polarities of the faces at the chamber 22 side may be mutually exchanged between the electromagnet 321 and the electromagnet 322. According to this, the direction of the magnetic force line is changed, and therefore, the posture of each of the magnetized magnetic particles 91 can be changed. Then, by performing the pretreatment again in that state, the pretreatment can be evenly carried out throughout the entire surface of each of the magnetic particles 91, and thus, the adhesion of the below-mentioned coating film 92 can be further enhanced.

Further, with respect to the electric current allowed to flow through the electromagnets 321 and 322, instead of switching the direction, energization may be switched between on and off. Also in that case, the posture of the magnetic particles 91 can be changed, and therefore, the same effect as described above can be expected.

Note that the pretreatment may be performed as needed, and may be omitted.

(S05) Formation of Coating Film

Subsequently, a valve (not shown) of the exhaust portion 24 is closed, and the raw material gas, that is, a precursor is introduced into the chamber 22 in a state where the inside of the chamber 22 is fully sealed. The raw material gas is adsorbed onto the surfaces of the magnetic particles 91. At that time, when the raw material gas is adsorbed onto the surfaces of the magnetic particles 91, further adsorption into a multilayer hardly occurs. Therefore, the film thickness of the coating film 92 to be finally obtained can be controlled with high accuracy. Further, the raw material gas also penetrates into portions behind or portions to become gaps and is adsorbed onto the portions, and therefore, the coating film 92 can be uniformly formed in the end even if the aspect ratio is high.

The temperature inside the chamber 22 is appropriately set according to the composition of the raw material gas or the oxidizing agent, or the like, but for example, is preferably 50° C. or higher and 500° C. or lower, more preferably 100° C. or higher and 400° C. or lower.

Further, the pressure inside the chamber 22 is set to, for example, 100 Pa or less.

Examples of the raw material gas include a gas containing the precursor of the coating film 92. Specifically, for example, when a silicon-based coating film 92 is formed, examples of the raw material gas include secondary amines such as dimethylamine, methylethylamine, and diethylamine, reaction products of a secondary amine and a trihalosilane such as trisdimethylaminosilane, bisdiethylaminosilane, and bistertiarybutylaminosilane.

Subsequently, the raw material gas is discharged by opening the valve of the exhaust portion 24, and thereafter, an inert gas such as nitrogen gas or argon gas is introduced as needed. By doing this, the raw material gas is replaced.

Subsequently, the valve of the exhaust portion 24 is closed, and thereafter, an oxidizing agent is introduced into the chamber 22. Examples of the oxidizing agent include ozone, plasma oxygen, and water vapor.

The oxidizing agent reacts with the raw material gas adsorbed onto the surfaces of the magnetic particles 91, whereby the coating film 92 is formed. The oxidizing agent also penetrates into portions behind or portions to become gaps in the same manner as the raw material gas, and therefore, the film thickness of the coating film 92 can be uniformly controlled with high accuracy.

Subsequently, the valve of the exhaust portion 24 is opened to discharge the oxidizing agent, and thereafter, an inert gas is introduced as needed to replace the oxidizing agent.

In the way described above, the coated magnetic particles 93 are obtained.

Exampled of the coating film 92 to be formed include oxides such as silicon oxide, hafnium oxide, tantalum oxide, and titanium oxide, and nitrides such as aluminium nitride, titanium nitride, and tantalum nitride. Further, the constituent material of the coating film 92 is not limited to an insulator, and may be an electrically conductive material depending on the use of the coated magnetic particles 93.

The film thickness of the coating film 92 is not particularly limited, but for example, is preferably 1 nm or more and 500 nm or less, more preferably 2 nm or more and 100 nm or less. If the film thickness falls within such a range, the coating film 92 can be uniformly formed in a relatively short time.

(S06) Aftertreatment

Subsequently, the coated magnetic particles 93 in the chamber 22 are subjected to an aftertreatment. Examples of the aftertreatment include a static elimination treatment and a radical treatment.

Among these, the static elimination treatment is a treatment for reducing the amount of electric charge generated by electrification of the coated magnetic particles 93. By performing such a static elimination treatment, aggregation or adhesion of the coated magnetic particles 93 accompanying electrification can be suppressed. Therefore, when the coating film 92 is formed again for the coated magnetic particles 93 as described later, occurrence of film formation failure due to unintended aggregation can be suppressed. In the static elimination treatment, for example, an ionizer is used.

Examples of the ionizer include a VUV ionizer for ionizing residual atoms or residual molecules in vacuum so as to eliminate static electricity by utilizing vacuum ultraviolet light, and soft X-ray static eliminator for ionizing residual atoms or residual molecules in vacuum so as to eliminate static electricity by utilizing X-ray ionization.

Further, the aftertreatment as described above is a treatment to be performed after forming the coating film 92 on the surfaces of the magnetic particles 91, and is preferably performed in a state where the coated magnetic particles 93 are fixed by a magnetic force caused by a magnetic field generated by the magnetic force generation portion 3. According to this, many gaps are present around the respective coated magnetic particles 93, and thus, the aftertreatment can be uniformly and efficiently carried out through the gaps.

At that time, the aftertreatment may be performed while alternately switching the direction of an electric current allowed to flow through the electromagnets 321 and 322. That is, the polarities of the faces at the chamber 22 side may be mutually exchanged between the electromagnet 321 and the electromagnet 322. According to this, the direction of the magnetic force line is changed, and therefore, the posture of each of the magnetized coated magnetic particles 93 can be changed. By performing the aftertreatment again in that state, the aftertreatment can be evenly carried out throughout the entire surface of each of the coated magnetic particles 93.

Further, with respect to the electric current allowed to flow through the electromagnets 321 and 322, instead of switching the direction, energization may be switched between on and off. Also in that case, the posture of the coated magnetic particles 93 can be changed, and therefore, the same effect as described above can be expected.

Note that the aftertreatment may be performed as needed, and may be omitted.

(S07) Release from Fixation

Subsequently, the energization of the electromagnets 321 and 322 is stopped so as to stop the generation of the electric field in the chamber 22. By doing this, the magnetic force disappears, and therefore, the fixation of the coated magnetic particles 93 is released. As a result, the coated magnetic particles 93 can be freely transported or the like.

(S08) Collection of Coated Magnetic Particles

Thereafter, if the film thickness of the coating film 92 is sufficient, the coated magnetic particles 93 are taken out from the chamber 22 and collected.

(S09) Refixation of Magnetic Particles

On the other hand, if the film thickness of the coating film 92 is not sufficient, the coating film 92 is formed again on the coated magnetic particles 93.

In order to do so, first, the electromagnets 321 and 322 are energized, whereby a magnetic field is generated in the chamber 22. By doing this, the coated magnetic particles 93 are fixed to the inner face of the chamber 22 and held there. As a result, the probability that the coated magnetic particles 93 are fixed in a posture different from when the particles are fixed before this refixation becomes very high. Therefore, refixation can be achieved in a state where also portions in which the coating film 92 was not formed because, for example, the magnetic particles 91 were in contact with each other in the previous formation of the coating film 92 are exposed. Then, thereafter, the process returns to the above-mentioned Step S05, and the coating film 92 is formed again. By doing this, the film thickness of the coating film 92 can be increased, and also the coating film 92 can be formed in the portions where the coating film was not formed in the previous operation. As a result, the coating film 92 can be formed more uniformly. Then, by repeating Step S05, Step S06, Step S07, and Step S09 a plurality of times, the coating film 92 satisfying a target film thickness can be formed.

As described above, the particle coating method according to this embodiment is a method including Step S02 of fixing the magnetic particles 91 by a magnetic force caused by a magnetic field generated in the chamber 22, and Step S05 of forming the coating film 92 on the surfaces of the magnetic particles 91 by an atomic layer deposition method. According to such a method, the magnetic particles 91 can be held by a magnetic force, and therefore, when the coating film 92 is formed by an atomic layer deposition method, even if the inside of the chamber 22 is exhausted by the exhaust portion 24, stirring up of the magnetic particles 91 is suppressed. As a result, the magnetic particles 91 can be prevented from being drawn into the exhaust portion 24 so that breakdown of the exhaust portion 24 or loss of the magnetic particles 91 can be suppressed. Further, the coverage of the coating film 92 provided on the surfaces of the magnetic particles 91 can be increased as described above.

Further, in this embodiment, after the magnetic particles 91 are fixed by a magnetic force in Step S02, the coating film 92 is formed in Step S05, and thereafter, the fixation is released in Step S07, and then, the magnetic particles 91 are fixed again in Step S09, and the coating film 92 is formed again in Step S05. Therefore, when the magnetic particles 91 are fixed again, the posture of each of the magnetized magnetic particles 91 can be changed. Due to this, the probability that the posture of the magnetic particle 91 is different between at the time of first formation of the coating film 92 and at the time of second formation of the coating film 92 becomes high. Accordingly, the coating film can be formed at the time of second formation in the portions where the coating film 92 could not be formed at the time of first formation. As a result, the surfaces of the magnetic particles 91 can be coated with the coating film 92 with a higher probability.

Further, at that time, the direction of an electric current allowed to flow through the electromagnets 321 and 322 may be switched. For example, the first formation of the coating film 92 may be performed in a state where a magnetic field is generated so that it is directed to the electromagnet 322 from the electromagnet 321, that is, in a state where the magnetic particles 91 are fixed by a magnetic force in a first direction, and thereafter, the second formation of the coating film 92 may be performed in a state where a magnetic field is generated so that it is directed to the electromagnet 321 from the electromagnet 322, that is, in a state where the coated magnetic particles 93 are fixed by a magnetic force in a second direction different from the first direction by switching the direction of an electric current.

That is, the particle coating method according to this embodiment includes Step S02 of fixing the magnetic particles 91 by a magnetic force in the first direction, Step S05 of forming the coating film 92 on the surfaces of the magnetic particles 91 by an atomic layer deposition method, thereby obtaining the coated magnetic particles 93, Step S09 of fixing the coated magnetic particles 93 by a magnetic force in the second direction different from the first direction, and Step S05 of forming the coating film 92 on the surfaces of the coated magnetic particles 93.

According to this, the direction of the magnetic force line is changed between the first formation and the second formation, and therefore, the posture of each of the magnetized magnetic particles 91 can be more reliably changed. As a result, the surfaces of the magnetic particles 91 can be coated with the coating film 92 with a higher probability.

Further, the respective treatments such as introduction or discharge of the raw material gas, introduction or discharge of the oxidizing agent, introduction or discharge of the inert gas, and the like may also be performed while alternately switching the direction of an electric current allowed to flow through the electromagnets 321 and 322. That is, the polarities of the faces at the chamber 22 side may be mutually exchanged between the electromagnet 321 and the electromagnet 322. According to this, the direction of the magnetic force line is changed, and therefore, the posture of each of the magnetized magnetic particles 91 can be changed. By performing the respective treatments again in that state, the respective treatments can be evenly carried out throughout the entire surface of each of the magnetic particles 91.

Second Embodiment

Next, a particle coating apparatus according to a second embodiment will be described.

Figure 5:
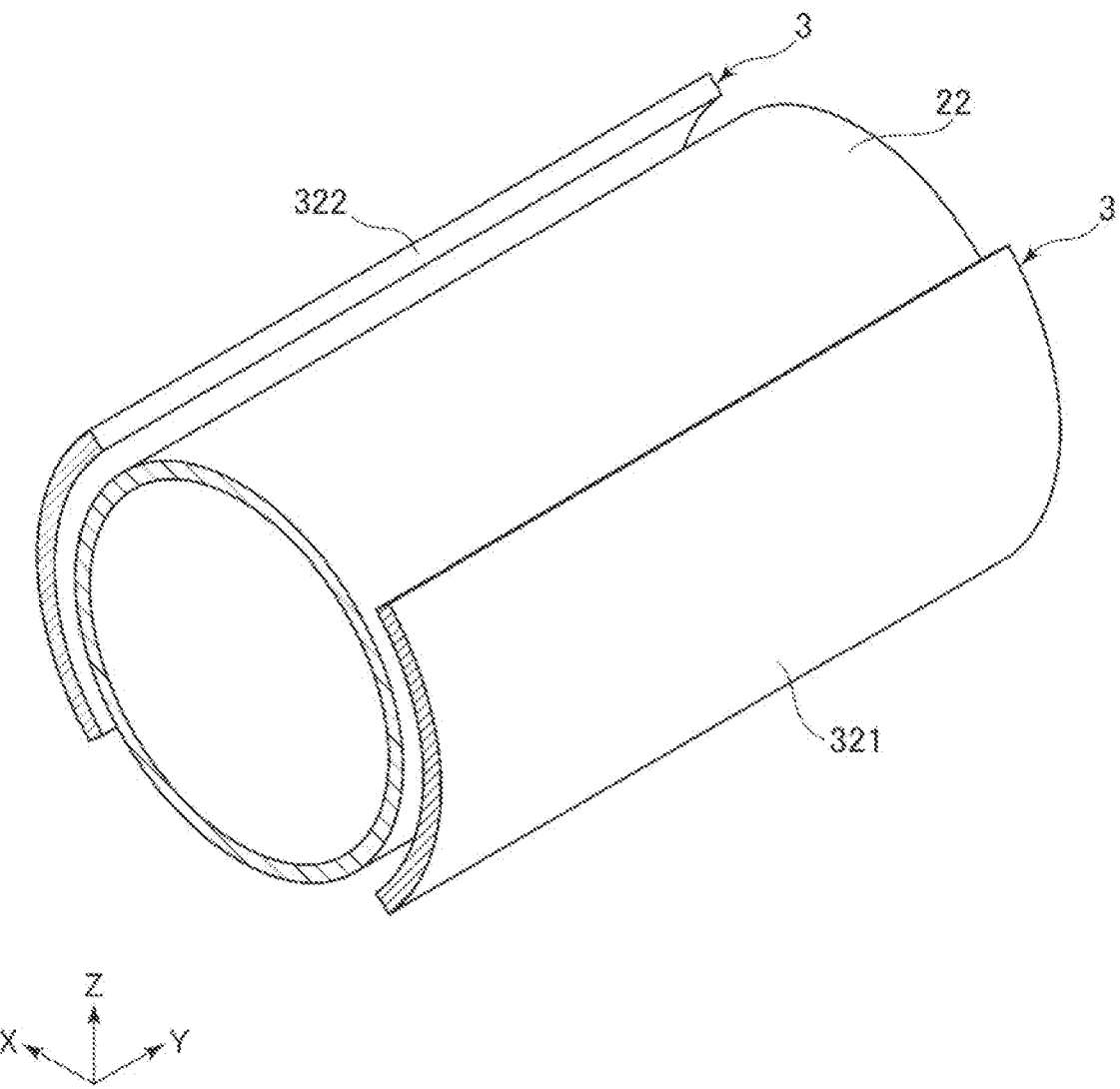
FIG. 5 is an exploded perspective view in which a portion of a particle coating apparatus according to a second embodiment is cut out and exploded.

FIG. 5 is an exploded perspective view in which a portion of a particle coating apparatus 1 according to the second embodiment is cut out and exploded.

Hereinafter, the second embodiment will be described, however, in the following description, different points from the first embodiment will be mainly described, and the description of the same matter will be omitted. Note that in FIG. 5, the same reference numerals are given to the same components as those in the above-mentioned embodiment.

The second embodiment is the same as the first embodiment except that the arrangement of the electromagnets 321 and 322 is different.

Specifically, the electromagnets 321 and 322 according to the first embodiment are provided at the upper face and the lower face of the chamber 22, however, the electromagnets 321 and 322 according to this embodiment are provided at side faces of the chamber 22. That is, the arrangement of the electromagnets 321 and 322 according to this embodiment is an arrangement resulting from rotating the arrangement of the electromagnets 321 and 322 according to the first embodiment by 90° with the Y axis as the axis of rotation.

Even when such an arrangement is adopted, the same effect as that of the first embodiment is obtained.

Third Embodiment

Next, a particle coating apparatus according to a third embodiment will be described.

Figure 6:
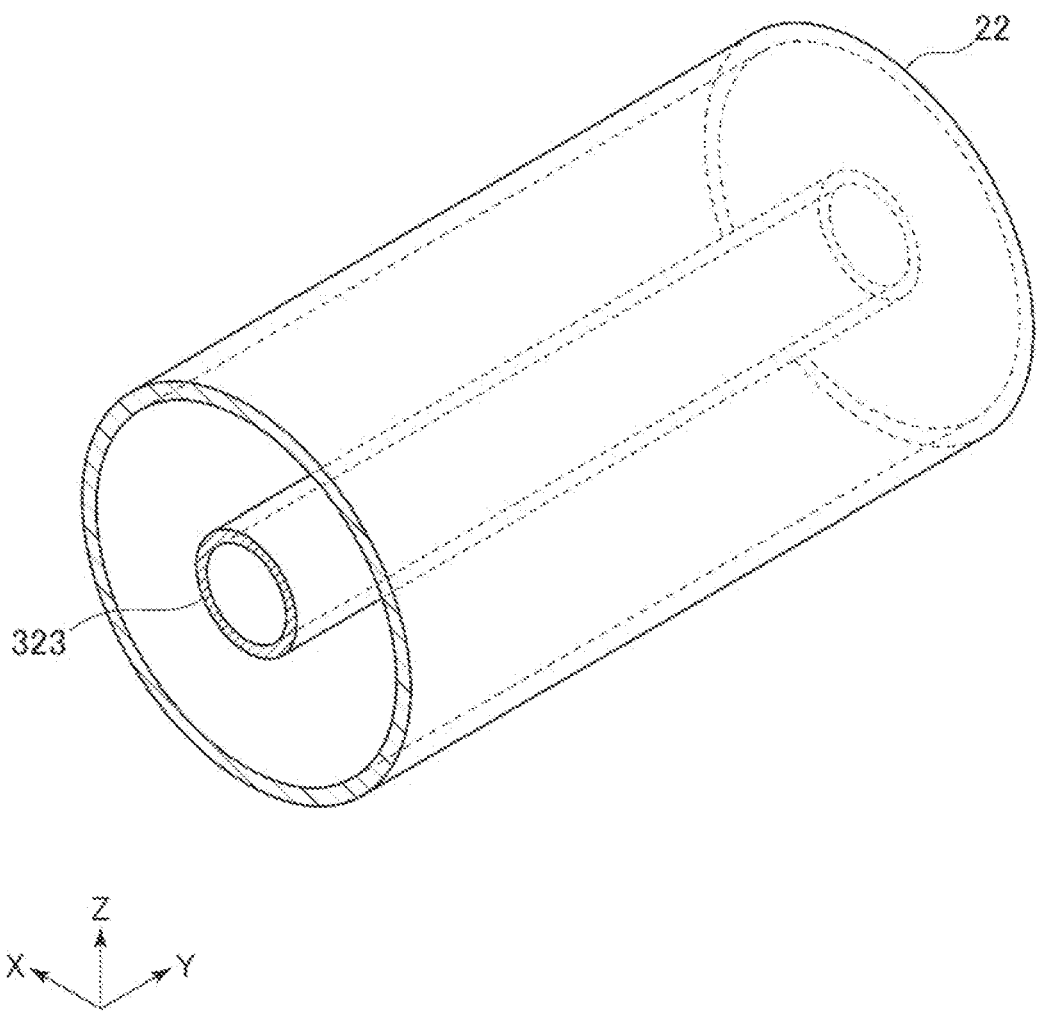
FIG. 6 is an exploded perspective view in which a portion of a particle coating apparatus according to a third embodiment is cut out and exploded.

FIG. 6 is an exploded perspective view in which a portion of a particle coating apparatus 1 according to the third embodiment is cut out and exploded.

Hereinafter, the third embodiment will be described, however, in the following description, different points from the first embodiment will be mainly described, and the description of the same matter will be omitted. Note that in FIG. 6, the same reference numerals are given to the same components as those in the above-mentioned embodiments.

The third embodiment is the same as the first embodiment except that the arrangement and shape of the electromagnet are different.

Specifically, the electromagnets 321 and 322 according to the first and second embodiments are provided outside the chamber 22, however, an electromagnet 323 according to this embodiment is inserted into the chamber 22.

The electromagnet 323 has a cylindrical shape and is inserted so as to be separated from the inner face of the chamber 22, and also, for example, overlapped with the central axis of the chamber 22. According to this, a space is formed between the side face of the electromagnet 323 and the inner face of the chamber 22.

When the electromagnet 323 is energized, the magnetic particles 91 are fixed so as to surround the electromagnet 323 and held there. According to this, in the same manner as in the first and second embodiments, stirring up of the magnetic particles 91 is suppressed so that breakdown of the exhaust portion 24 or loss of the magnetic particles 91 can be suppressed.

In this embodiment, by repeatedly switching energization of the electromagnet 323 between on and off, the magnetic particles 91 can be held while changing the posture of each of the magnetic particles 91. Therefore, by forming the coating film 92 while changing the posture of each of the magnetic particles 91, also in this embodiment, the coating film 92 can be formed more uniformly on the magnetic particles 91.

Further, the electromagnet 323 that is the magnetic force generation portion 3 shown in FIG. 6 is provided inside the chamber 22 that is the vessel as described above. According to this, a stronger magnetic force can be generated by the electromagnet 323 so that the magnetic particles 91 can be more strongly fixed. Therefore, even when the amount of the magnetic particles 91 is large, stirring up of the magnetic particles 91 can be suppressed.

Figure 7:
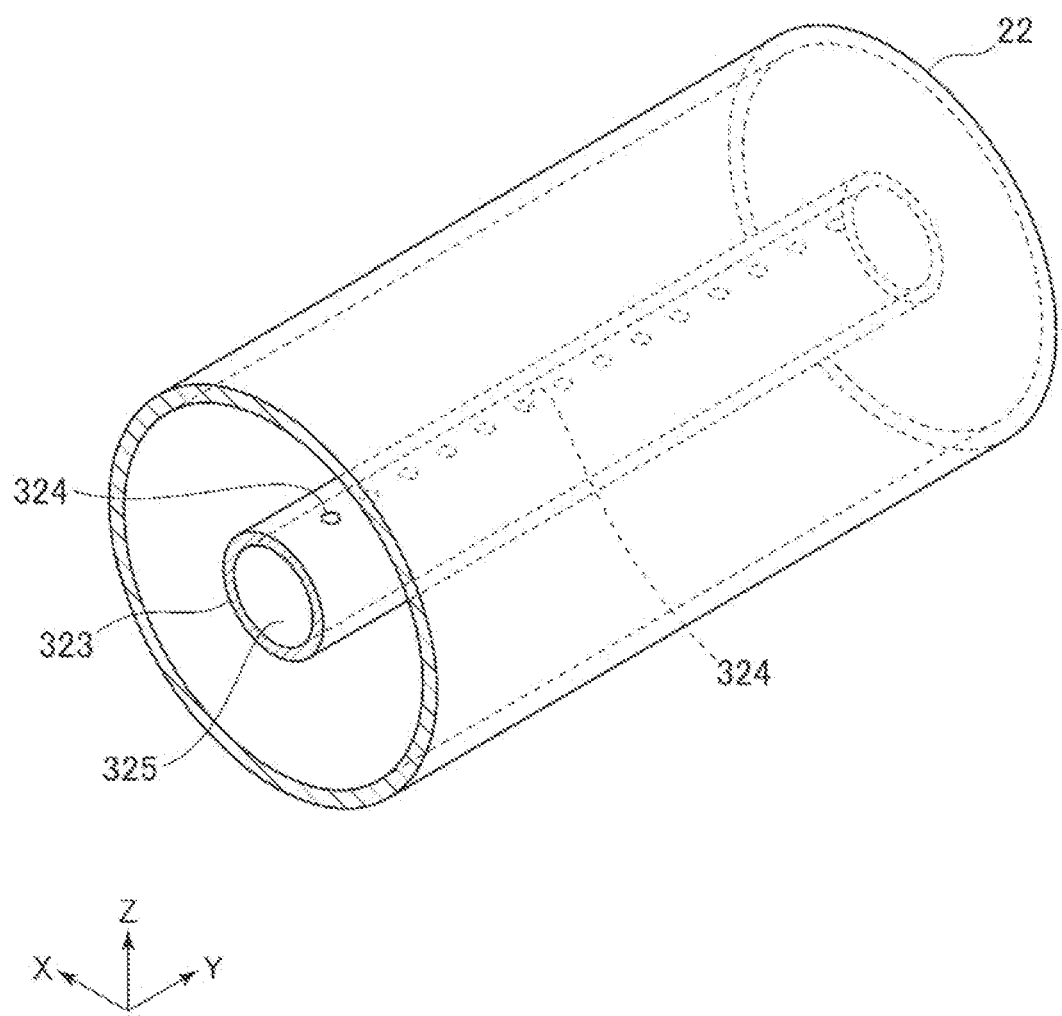
FIG. 7 is a modification of the particle coating apparatus shown in FIG. 6.

FIG. 7 is a modification of the particle coating apparatus 1 shown in FIG. 6.

The electromagnet 323 shown in FIG. 7 has a cylindrical shape in the same manner as the electromagnet 323 shown in FIG. 6. Further, an inner portion 325 of the electromagnet 323 shown in FIG. 7 becomes a channel through which the raw material gas and the oxidizing agent flow. Then, the inner portion 325 and an outer portion of the electromagnet 323 communicate with each other through a through-hole 324. According to this, each of the raw material gas and the oxidizing agent is supplied into the chamber 22 from the inner portion 325 of the electromagnet 323 through a plurality of through-holes 324. By forming such a supply path, the raw material gas and the oxidizing agent can be more directly supplied to the magnetic particles 91 fixed to the electromagnet 323.

That is, when the magnetic particles 91 are fixed to the electromagnet 323, depending on the fixing condition, the magnetic particles 91 are adhered to one another, so that a gap is hardly generated between the magnetic particles 91 in some cases. In such a case, it may become difficult for the raw material gas or the oxidizing agent to penetrate into the gap between the magnetic particles 91, and uniform formation of the coating film 92 may be inhibited. On the other hand, by supplying the raw material gas or the like from the inner portion 325 of the electromagnet 323 through the through-holes 324, the contact opportunity between the magnetic particles 91 and the raw material gas or the like can be increased. As a result, the coating film 92 can be more uniformly formed.

Also in the third embodiment and the modification thereof as described above, the same effect as that of the first embodiment is obtained.

Fourth Embodiment

Next, a particle coating apparatus according to a fourth embodiment will be described.

Figure 8:
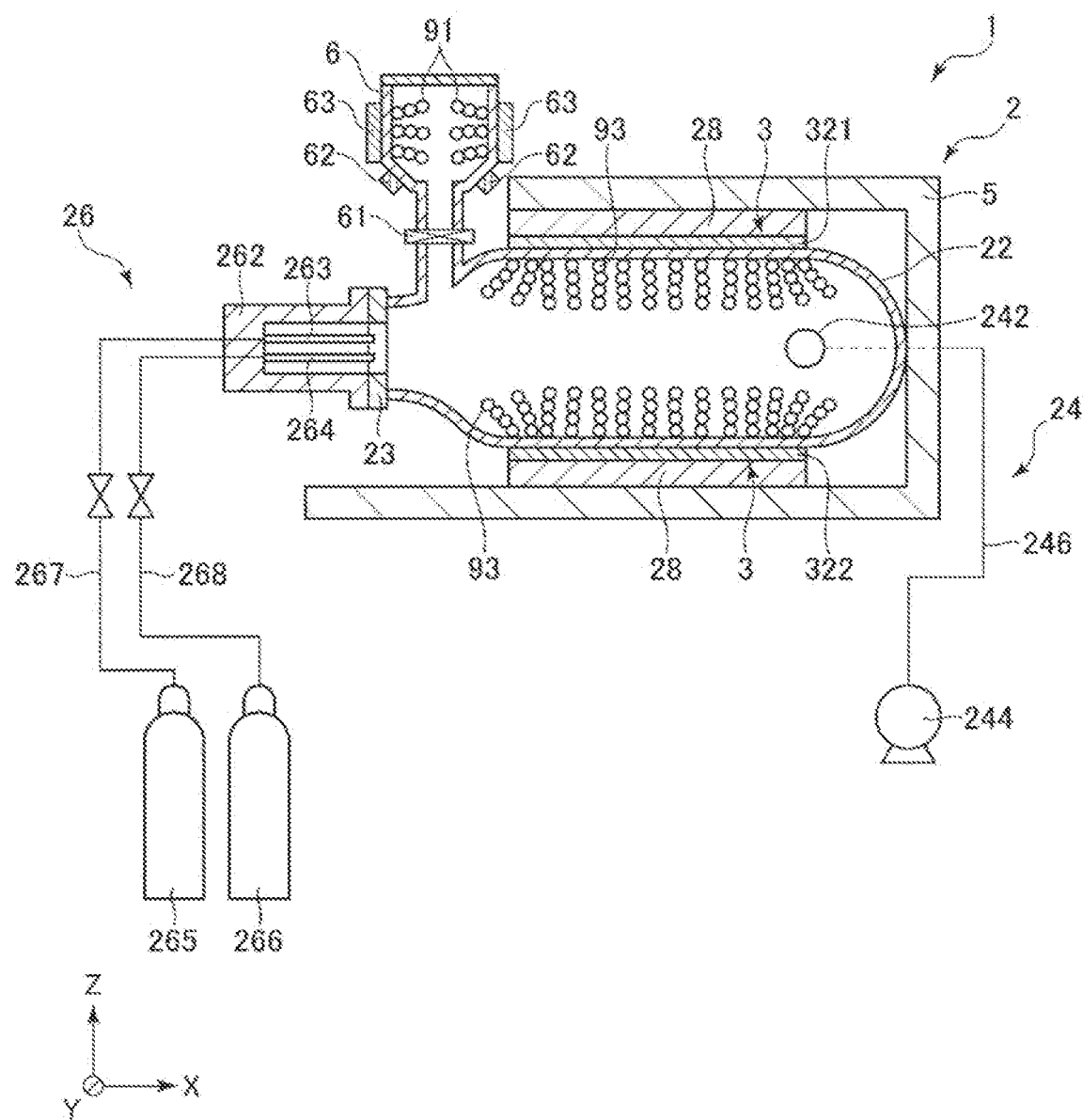
FIG. 8 is a cross-sectional view showing a particle coating apparatus according to a fourth embodiment.

FIG. 8 is a cross-sectional view showing a particle coating apparatus 1 according to the fourth embodiment. Note that in FIG. 8, illustration of part of the configuration is omitted.

Hereinafter, the fourth embodiment will be described, however, in the following description, different points from the first embodiment will be mainly described, and the description of the same matter will be omitted. Note that in FIG. 8, the same reference numerals are given to the same components as those in the above-mentioned embodiments.

The particle coating apparatus 1 shown in FIG. 8 is the same as that of the first embodiment except that a front chamber 6 coupled to the chamber 22 is included. That is, the particle coating apparatus 1 shown in FIG. 8 includes the front chamber 6, a valve 61 for opening and closing between the front chamber 6 and the chamber 22, a front chamber heating portion 62 provided at an outer face of the front chamber 6, and a front chamber electromagnet 63 provided at an outer face of the front chamber 6 in addition to the first embodiment. Further, according to need, a front chamber gas introduction portion introducing an arbitrary gas or a front chamber exhaust portion exhausting the inside of the front chamber 6 may be coupled to the front chamber 6.

By providing such a front chamber 6, the above-mentioned pretreatment can be performed in the front chamber 6. Therefore, the pretreatment in the front chamber 6 and the formation of the coating film 92 in the chamber 22 can be performed in parallel at the same time. Then, by collecting the coated magnetic particles 93 produced in the chamber 22, and thereafter subsequently transferring the magnetic particles 91 subjected to the pretreatment in the front chamber 6 to the chamber 22, the pretreatment in the chamber 22 can be omitted. According to this, the time required for the production of the coated magnetic particles 93 can be shortened, and thus, the production efficiency can be enhanced.

The front chamber 6 is a vessel coupled to the chamber 22, and is constituted by, for example, the same material as the chamber 22. However, it may be constituted by a different material.

Then, by also providing the front chamber electromagnet 63 in the front chamber 6, the magnetic particles 91 are fixed to the inner face of the front chamber 6 and held there, however, at that time, the magnetic particles 91 are held in a state where many surfaces of the respective magnetic particles 91 are exposed. Therefore, the pretreatment can be uniformly performed for the respective magnetic particles 91.

The front chamber electromagnet 63 and the front chamber heating portion 62 are configured in the same manner as the above-mentioned electromagnets 321 and 322 and heating portion 28.

Also in the fourth embodiment as described above, the same effect as that of the first embodiment is obtained.

Fifth Embodiment

Next, a particle coating apparatus according to a fifth embodiment will be described.

Figure 9:
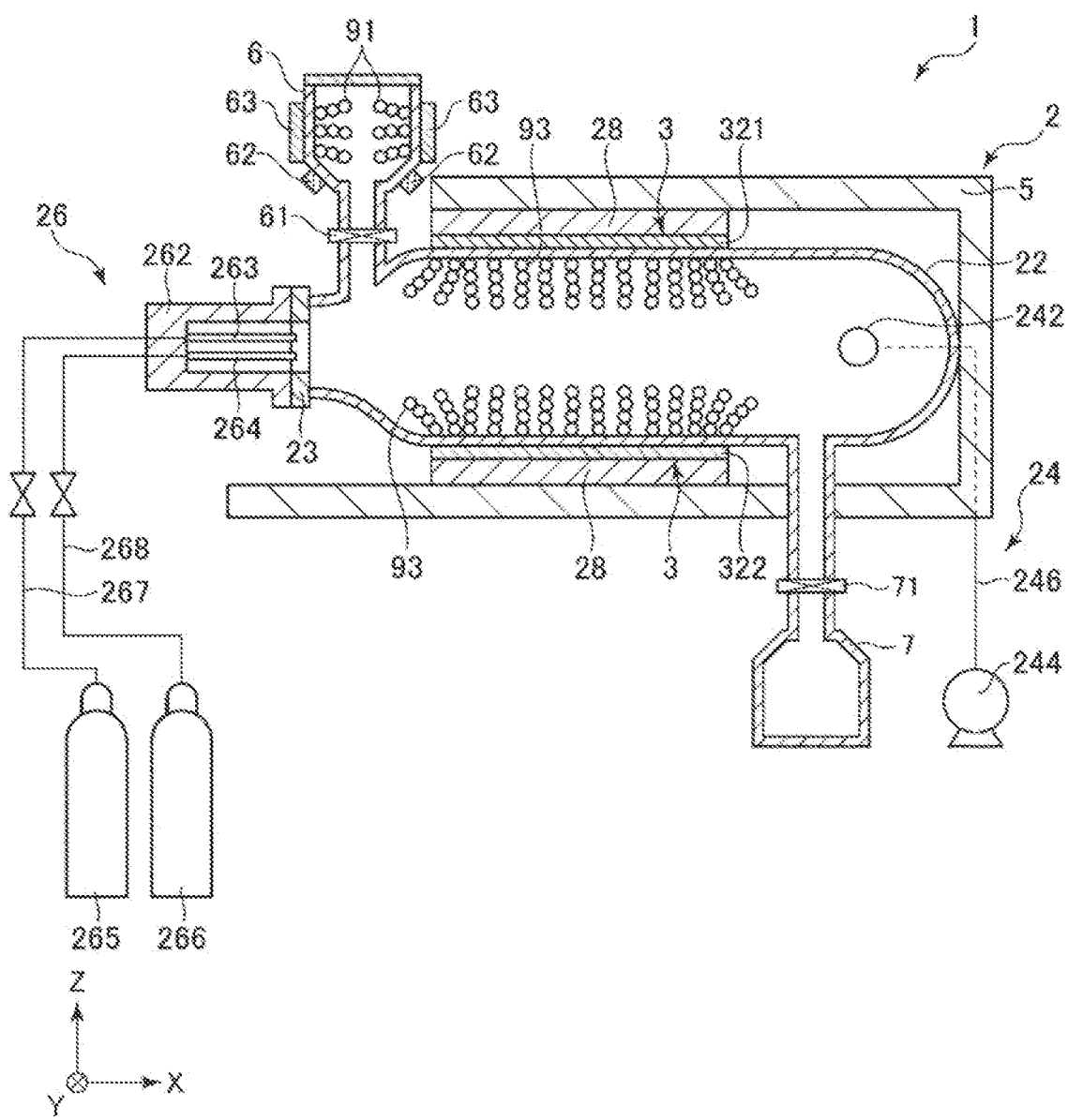
FIG. 9 is a cross-sectional view showing a particle coating apparatus according to a fifth embodiment.

FIG. 9 is a cross-sectional view showing a particle coating apparatus 1 according to the fifth embodiment. Note that in FIG. 9, illustration of part of the configuration is omitted.

Hereinafter, the fifth embodiment will be described, however, in the following description, different points from the fourth embodiment will be mainly described, and the description of the same matter will be omitted. Note that in FIG. 9, the same reference numerals are given to the same components as those in the above-mentioned embodiments.

The particle coating apparatus 1 shown in FIG. 9 is the same as that of the fourth embodiment except that a collection portion 7 coupled to the chamber 22 is included. That is, the particle coating apparatus 1 shown in FIG. 9 includes the collection portion 7 and a valve 71 for opening and closing between the collection portion 7 and the chamber 22 in addition to the fourth embodiment.

The collection portion 7 is a vessel coupled to the chamber 22, and is, for example, configured to be transportable by being separated from the chamber 22 as needed. According to this, the coated magnetic particles 93 produced in the chamber 22 can be easily transferred to the collection portion 7, and also the collection portion 7 in which the coated magnetic particles 93 are housed can be transported as it is.

As a method for transferring the coated magnetic particles 93 to the collection portion 7 from the chamber 22, for example, a method in which the coated magnetic particles 93 are transferred to just above the collection portion 7 by moving the electromagnet 321 in a state where the coated magnetic particles 93 are fixed by a magnetic force caused by a magnetic field generated by the electromagnet 321, and the coated magnetic particles 93 are dropped into the collection portion 7 by cutting off the energization of the electromagnet 321 there, and the like are exemplified. That is, in such a case, the electromagnet 321 that is the magnetic force generation portion 3 is provided movably with respect to the chamber 22. According to this, the coated magnetic particles 93 can be moved using the electromagnet 321.

Also in the fifth embodiment as described above, the same effect as that of the first embodiment is obtained.

Hereinabove, the particle coating method and the particle coating apparatus according to the present disclosure have been described based on the embodiments shown in the drawings, however, the present disclosure is not limited thereto, and for example, the particle coating method according to the present disclosure may be a method in which an arbitrary target step may be added to the above-mentioned embodiments. Further, in the particle coating apparatus according to the present disclosure, the configuration of each portion of the above-mentioned embodiments may be replaced with an arbitrary configuration having the same function. In addition, in the particle coating apparatus according to the present disclosure, another arbitrary structure may be added to the above-mentioned embodiments.

Further, a relationship between the axial direction of the chamber and the vertical direction is not particularly limited, and the axial direction of the chamber may be parallel or perpendicular to the vertical direction, or may be an intermediate direction between these directions, that is, a diagonal direction.

EXAMPLES

Hereinafter, specific Examples of the present disclosure will be described.

1. Production of Coated Magnetic Particles

Examples

First, Fe—Si—Cr-based magnetic particles having an average particle diameter of 3.5 μm were fed into a chamber made of quartz glass. Then, the magnetic particles were fixed and held by a magnetic force caused by a magnetic field of a permanent magnet attached to an outer face of the chamber.

Subsequently, an exhaust pump was operated, and the inside of the chamber was exhausted and brought into a depressurized state. In the middle of an exhaust path of the exhaust pump, a filter was attached in advance. Then, an ozone treatment was performed as a pretreatment. Further, by heating the chamber at the same time, the magnetic particles were dried.

Subsequently, the atmosphere in the chamber was replaced with nitrogen gas, and thereafter, a valve provided in an exhaust portion was closed, and trisdimethylaminosilane was introduced as a raw material gas (precursor). The temperature inside the chamber at that time was 200° C.

Subsequently, the valve provided in the exhaust portion was opened, and the raw material gas was discharged.

Subsequently, the atmosphere in the chamber was replaced with nitrogen gas, and thereafter, the valve provided in the exhaust portion was closed, and ozone was introduced as an oxidizing agent. By doing this, the raw material gas and the oxidizing agent were reacted with each other, whereby coated magnetic particles were obtained.

Subsequently, the valve provided in the exhaust portion was opened, and ozone was discharged.

Subsequently, as an aftertreatment, a static elimination treatment using an ozonizer was performed.

Subsequently, the holding of the coated magnetic particles was released by removing the permanent magnet, and thereafter, the coated magnetic particles were fixed and held again by the magnetic force of the permanent magnet.

Then, a series of steps of formation of a coating film, aftertreatment, release from fixation, and refixation was repeated 250 times in total. As a result, coated magnetic particles coated with a coating film having a film thickness of 10 nm were obtained.

Comparative Example

Coated magnetic particles were obtained in the same manner as in Example except that the attachment of the permanent magnet to the outer face of the chamber was omitted.

2. Evaluation of Occurrence of Drawing into Exhaust Pump

Subsequently, the filter in the exhaust path was detached, and the surface of the filter was observed with an electron microscope. As a result, in the filter used when producing the coated magnetic particles in Comparative Example, many magnetic particles were captured. On the other hand, it was confirmed that in the filter used when producing the coated magnetic particles in Example, the number of captured magnetic particles was sufficiently smaller than that.

From the above results, it was confirmed that according to the present disclosure, the magnetic particles can be prevented from being drawn into the exhaust pump.

3. Evaluation of Coated Magnetic Particles

Subsequently, from the coated magnetic particles aggregated by a magnetic force caused by a magnetic field of a permanent magnet among the obtained coated magnetic particles, a coated magnetic particle located in a surface layer of an aggregate and a coated magnetic particle located in the vicinity of the center of the aggregate were taken out, respectively. Then, with respect to the surfaces of the coated magnetic particles, an elemental composition was evaluated by X-ray photoelectron spectroscopy (electron spectroscopy for chemical analysis (ESCA)). Further, also with respect to the surfaces of the magnetic particles before forming the coating film, an elemental composition was evaluated. The evaluation results are shown in Table 1.

TABLE 1

|  | Magnetic particles at % | Coated magnetic particles located in inner portion of aggregate at % | Coated magnetic particles located in surface layer of aggregate at % |
| --- | --- | --- | --- |
| C 1s | 41.5 | 26.7 | 24.9 |
| N 1s | 1.6 | 0.6 | 0.5 |
| O 1s | 40.7 | 51.6 | 52.8 |
| Si 2p | 6.6 | 21.1 | 21.8 |
| Cr 2p | 1.1 | 0 | 0 |
| Fe 2p | 8.5 | 0 | 0 |
| Total | 100 | 100 | 100 |

Table 1 is a table showing the results of analyzing the elemental composition by X-ray photoelectron spectroscopy with respect to the surface of each of the magnetic particles and the coated magnetic particles.

As shown in Table 1, on the surface of the magnetic particle before forming the coating film, the existence of Fe and Cr derived from the Fe—Si—Cr-based alloy that is the constituent material of the magnetic particle was confirmed. Therefore, it is suggested that on the surface of the magnetic particle, Fe and Cr contained in the constituent material are exposed, and the surface is not completely coated with the coating film.

On the other hand, with respect to the coated magnetic particles, there were almost no Fe and Cr on the surface thereof. Further, Fe and Cr were not detected on the surface even if it is a coated magnetic particle present in an inner portion of the aggregate or a coated magnetic particle present in a surface layer of the aggregate in the aggregate of the coated magnetic particles formed by a magnetic force caused by a magnetic field of a permanent magnet. Therefore, it is suggested that with respect to the obtained coated magnetic particles, the surface is almost completely coated with the coating film regardless of the location in the aggregate.

Therefore, it was confirmed that according to the present disclosure, coated magnetic particles uniformly coated with a thin coating film having a nanometer-order film thickness can be produced.

What is claimed is:

1. A particle coating apparatus, comprising:
   a film formation device that includes a vessel housing magnetic particles, an exhaust portion exhausting and depressurizing the inside of the vessel, and a gas introduction portion introducing a gas into the vessel, and that forms a coating film on surfaces of the magnetic particles by an atomic layer deposition method;
   a magnetic force generation portion generating a magnetic field in the vessel so as to fix the magnetic particles by a magnetic force caused by the magnetic field; and
   a pretreatment portion subjecting the magnetic particles to a pretreatment in a state where the magnetic particles are fixed by the magnetic force before forming the coating film on the surfaces of the magnetic particles,
   wherein the pretreatment portion includes an oxidizing portion for oxidizing surfaces of the magnetic particles and a drying portion for drying the magnetic particles;
   wherein the magnetic force generation portion generates the magnetic field in the vessel so as to fix the magnetic particles to the vessel by the magnetic force caused by the magnetic field, and
   the magnetic force generation portion is arranged along a face of the vessel.

2. The particle coating apparatus according to claim 1, wherein the magnetic force generation portion is provided outside the vessel.

3. The particle coating apparatus according to claim 1, wherein the magnetic force generation portion is provided inside the vessel.

4. The particle coating apparatus according to claim 1, wherein the magnetic force generation portion is an electromagnet.

5. The particle coating apparatus according to claim 1, wherein the magnetic force generation portion is provided movably with respect to the vessel.

* * * * *